(12) United States Patent
Rotariu et al.

(10) Patent No.: US 7,181,296 B2
(45) Date of Patent: Feb. 20, 2007

(54) METHOD OF ADAPTIVE INTERACTIVE LEARNING CONTROL AND A LITHOGRAPHIC MANUFACTURING PROCESS AND APPARATUS EMPLOYING SUCH A METHOD

(75) Inventors: Andreea Iuliana Rotariu, Sydney (AU); Rogier Ellenbroek, Den Haag (NL); Maarten Steinbuch, Helmond (NL); Gregor Edward Van Baars, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 470 days.

(21) Appl. No.: 10/857,450

(22) Filed: Jun. 1, 2004

(65) Prior Publication Data

US 2005/0043834 A1    Feb. 24, 2005

(30) Foreign Application Priority Data

Aug. 6, 2003    (EP) .................................. 03077461

(51) Int. Cl.
*G05B 13/02* (2006.01)
*G05B 19/18* (2006.01)
*G05B 13/04* (2006.01)
*G05B 1/06* (2006.01)
*G05B 11/00* (2006.01)
*G06F 19/00* (2006.01)
*G06F 15/18* (2006.01)
*G06G 7/00* (2006.01)

(52) U.S. Cl. ............................. 700/44; 700/60; 700/63; 700/65; 700/121; 706/21; 706/22; 706/23; 318/607; 318/638; 318/687

(58) Field of Classification Search .................. 700/17, 700/28–31, 44, 47, 55, 56, 60, 61, 63, 65, 700/117–121; 706/21–23; 318/560, 607, 318/638, 652, 671, 687
See application file for complete search history.

(56) References Cited

U.S. PATENT DOCUMENTS

| | | | |
|---|---|---|---|
| 6,373,033 B1 * | 4/2002 | de Waard et al. ........... | 219/497 |
| 6,449,369 B1 * | 9/2002 | Carme et al. ............ | 381/71.12 |
| 6,563,663 B1 | 5/2003 | Bi et al. | |
| 6,686,716 B1 * | 2/2004 | Predina et al. .............. | 318/560 |

OTHER PUBLICATIONS

Time-frequency Analysis of a Motion System with Learning Control, written by Rotariu et al., Jun. 4-6, 2003, pp. 3650-3654.
Stability of a Novel Iterative Learning Control Scheme with Adaptive Filtering, written by Danian Zheng and Andrew Alleyne, Jun. 4-6, 2003, pp. 4512-4517.
Synthesis of a Robust Iterative Learning Controller Using an H_Approach, written by D. de Roover, Dec. 1996, pp. 3044-3049.
European Search Report in reference to EP 03 07 7461.

* cited by examiner

*Primary Examiner*—Crystal J. Barnes
(74) *Attorney, Agent, or Firm*—Pillsbury Winthrop Shaw Pittman LLP

(57) ABSTRACT

By applying time-frequency analysis to a given standard iterative learning control or ILC an adaptive filter for the learned feed-forward loop is designed. This time varying filter varies according to the momentary frequency content of the error signal and allows to discriminate between areas of deterministic and stochastic error. Its application results in selective application of ILC to those intervals where error signals of high level are concentrated and allows application of a single ILC acquisition to different setpoint trajectories. The adaptive filter finds particular use in lithographic scanning systems where it is used for varying scan length.

20 Claims, 11 Drawing Sheets

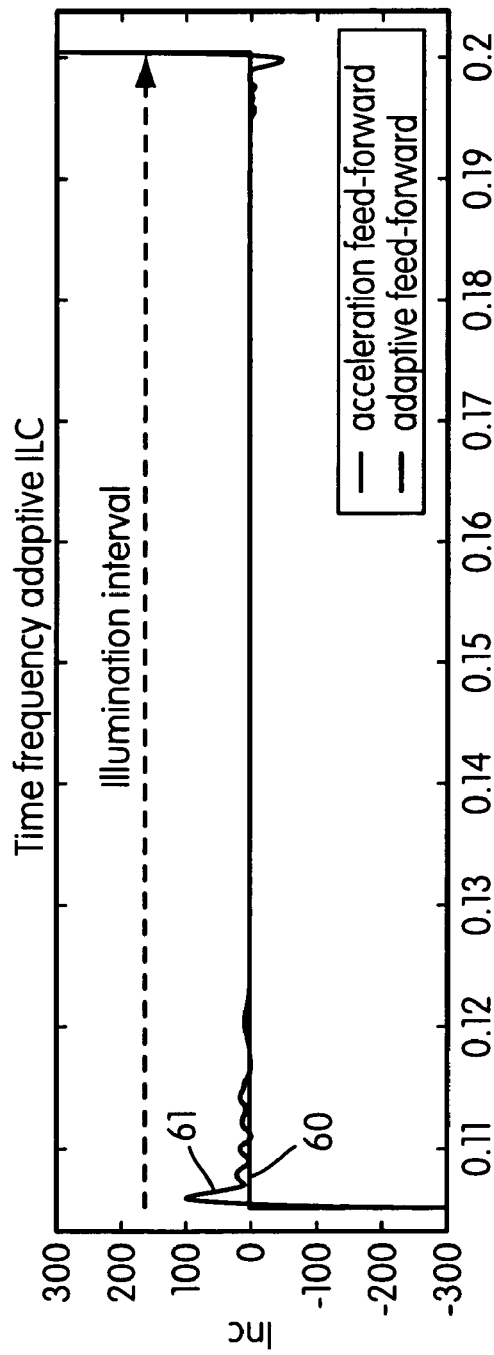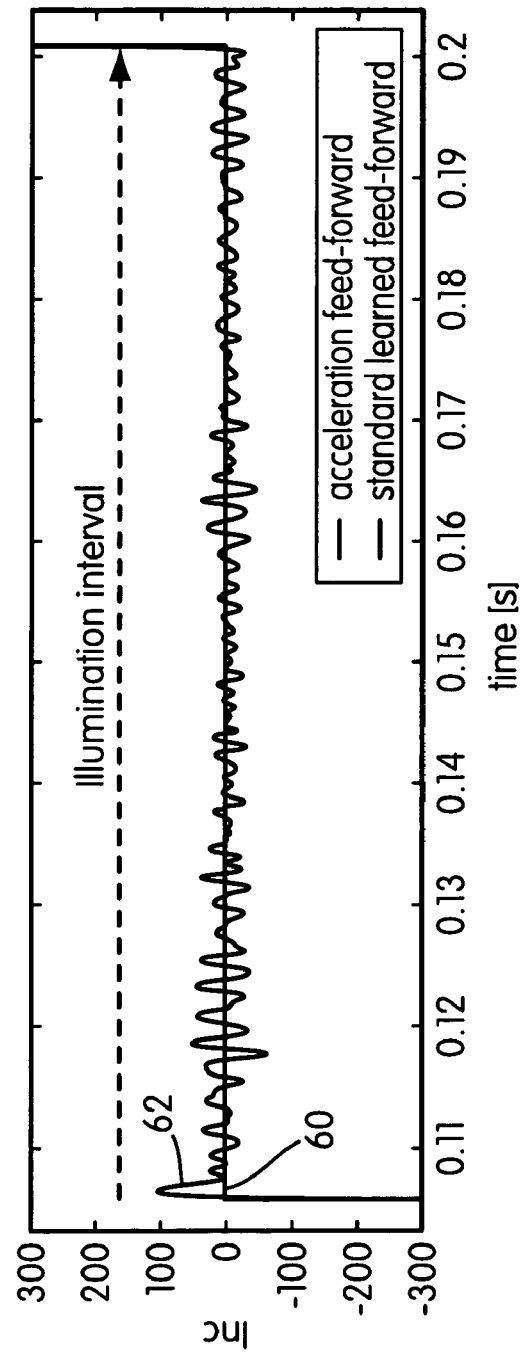

METHOD OF ADAPTIVE INTERACTIVE LEARNING CONTROL AND A LITHOGRAPHIC MANUFACTURING PROCESS AND APPARATUS EMPLOYING SUCH A METHOD

BACKGROUND OF THE INVENTION

1. Priority Information

This application claims priority from European Patent Application No. 03077461.6, filed Aug. 6, 2003, herein incorporated by reference in its entirety.

2. Field of the Invention

The invention concerns a method of controlling a system or process using a learned feed-forward signal, a control system and a lithographic projection apparatus.

3. Description of the Related Art

The essential steps in the manufacturing process of integrated circuits (ICs) are performed by lithographic machines called wafer scanners or wafer steppers. Important modules of these machines are the wafer and reticle stages. According to current state of the art, a wafer stage is normally a motion system, which positions the silicon wafer with respect to the illumination optics with high precision. As ICs are becoming smaller, the required precision increases proportionally. In order to meet positioning specifications that are currently in the order of nanometers, they require careful design. This is not only the case for the mechanical construction, but also for the design of actuators, electronics, software, measurement and control systems, etc.

In control system design, such specifications could so far be met using basic, well known concepts such as conventional feedback with PID (position plus integral plus derivative control action) controllers and conventional feed-forward based on rigid body acceleration. In the future, these concepts may prove insufficient to achieve the desired tracking performance, for which more advanced designs will be needed. As, in the present case, the control objective is to move an object along a predefined trajectory, the control problem is said to be one of "tracking". The "tracking performance," as understood in the art, is the accuracy with which the predefined trajectory is followed.

There are different kinds of disturbance acting on the system, including disturbances introduced by the setpoint. That is, although a setpoint is known and deliberate, it will be appreciated that it, nevertheless, "disturbs" the steady state condition. Feedback and feed-forward control deal with the stability and performance (in terms of tracking error), but additional control techniques, for example, iterative learning control (ILC), provides options for significantly improving the tracking performance (compared to conventional feedback and feed-forward) of the processes or systems that execute the same trajectory, motion or operation repetitively.

When only conventional feedback and feed-forward are applied to the considered motion system, the servo error often appears to temporarily exceed the required specifications and, in most cases, it bounds on the allowed amplitude of tracking errors. It then takes a certain settling time for this error to settle within specifications again. Learned feed-forward control can improve the tracking performance and shorten the settling time. For motion systems that repeatedly perform the same movement, a feed-forward technique called Iterative Learning Control or ILC can be applied to improve system performance in terms of elimination of the repeating portion in the tracking error. For a detailed description of iterative learning control, reference is made to Tomizuka M., T. C. Tsao and K. K. Chen "Discrete domain analysis and synthesis of repetitive controllers" Proc. 1988, American Control Conference, June 1988, pp. 860–866.

ILC generates a learned feed-forward signal, effective for providing good tracking control performance. The basic principle behind ILC is that it exploits possibilities to incorporate past repetitive control information, such as tracking errors and control input signals into the synthesis of a new feed-forward signal. Past control information is stored and then used in the control action in order to ensure that the system meets the control specifications such as convergence of the servo error during the learning process. The final result after applying ILC is that the magnitude of the servo errors is relatively small, the periodic disturbances are suppressed or, in other words, the tracking performance is no longer deteriorated by periodic contributions. Such performance improvement allows for shortening settling times and thereby improving productivity of various processes.

SUMMARY OF THE INVENTION

Although ILC leads to a good tracking performance, several issues remain that prevent it from being widely used for industrial applications. Experience with ILC algorithms applied to various motion systems has shown that ILC has limited performance within the context of position-dependent dynamics. Further, understanding and controlling position-dependent dynamics (seen as a non-linear system) while motion tracking on different positions is a problem.

Furthermore, ILC does not account for setpoint trajectory changes. The learned feed-forward signal depends on the reference signal and therefore, for different motion profiles a new feed-forward must be issued each time the profile changes. In other words, a new iterative learning procedure must be carried out for each different profile. Despite a very good tracking error performance, completion of the ILC procedure and the implementation of a suitable feed-forward signal, which corresponds to a certain setpoint profile costs time. Studies conducted towards robustness of the learned feed-forward signal against set-point changes are known from "M. Steinbuch, Repetitive control for systems with uncertain period-time, Automatica, vol. 38(42), 2002", but they have not yet led to a satisfactory solution.

Finally, noise amplification can be a problem. In applying ILC, the periodic or deterministic errors are learned while however the stochastic or random effects (noise) and other non-repetitive disturbances are amplified.

For wafer scanning systems, the fact that the learned feed-forward signal is dependent on the setpoint constitutes the main drawback, since the setpoint is related to the frequently changing size of the die, which is illuminated in the scanning process.

For at least one of the issues identified above, the principles of the present invention, as embodied and broadly described herein, provide for method of controlling a system or process using a learned feed-forward signal and, in particular, an iterative learning control method that is applied to lithographic wafer scanning systems. In one embodiment, the method comprises executing a feed-forward control of the system or process according based on a first setpoint signal that is indicative of a first setpoint trajectory; determining an error signal between the first setpoint signal and an output signal of the system or process; performing a time-frequency analysis of the error signal; identifying frequency components and corresponding levels of the error signal as a function of time based on the time-frequency analysis; determining a time-varying bandwidth for a filter based on the identified frequency components as a function of time, such that repetitive dynamic attributes exhibited by the system or process are incorporated into the learned feed-forward signal at the appropriate time instants; applying the filter to the learned feed-forward signal; and generating a control signal in response to applying the filter.

By applying time-frequency analysis to a given standard ILC insight is gained into the dynamics of the considered system and into the learning process. In particular it shows the distribution of a parameter, such as energy or amplitude, of the error signal (i.e. against time and frequency) and reveals that the high level, for example, high energy levels, of the servo error signal is concentrated very locally in time.

The learning process has therefore less potential for improving tracking performance for the time-instants outside these intervals, where it only leads to amplification of noise, thus, the filter in the learned feed-forward path is adapted accordingly, to the effect that ILC is concentrated only within the areas of the setpoint trajectory where the high energy signals are concentrated.

Using this scheme an adaptive filter is introduced that adapts according to the momentary frequency content of the error signal. This leads to a time-frequency adaptive ILC that features a reduced noise amplification compared to standard ILC, while achieving an equivalent suppression of repetitive errors. This scheme moreover produces one learned feed-forward signal for a first setpoint trajectory that can be used for different setpoint trajectories. Further, the insights gained from this technique can be used to solve the problem of setpoint dependency of ILC.

In one embodiment, there is provided a method of controlling a system wherein the system or process is controlled over a further setpoint trajectory differing from the predetermined setpoint trajectory only with respect those parts of the predetermined setpoint trajectory which do not cause the system or process to exhibit the repetitive dynamics, wherein the feed-forward signal for the further setpoint trajectory is developed from the learned feed-forward signal for the predetermined setpoint trajectory by inserting or removing values for the part of the further setpoint trajectory differing from that of the predetermined setpoint trajectory.

Thus, for example, the motion system of a lithographic projection apparatus is seen to exhibit repetitive deterministic system dynamics at the beginning and at the end of the setpoint trajectory, that is predominantly during and shortly after acceleration and during deceleration, respectively. Between these acceleration and deceleration intervals, that is during the scan (i.e. when the stage is moved at constant velocity) the feed-forward signal may be given constant, typically zero, values. Using this insight, a feed-forward signal can be developed for further setpoint trajectories differing only from a first setpoint trajectory in terms of its scan length without having to perform learning again. The learned feed-forward signal for a first learned setpoint trajectory is "prolonged" or "shortened" by inserting or removing zeros, respectively, for the corresponding interval intermediate the acceleration and deceleration intervals, to develop a modified feed-forward signal corresponding to the required scan length.

In other words, a modified feed-forward signal is developed by "cutting" values from the first feed-forward signal in the interval of constant velocity or "pasting" in additional values in the interval of constant velocity corresponding to the difference in scan length between a first scan length and a further different scan length, to achieve a feed-forward signal for controlling the system or process over the further, different scan length.

BRIEF DESCRIPTION OF DRAWINGS

Embodiments of the invention will now be described, by way of example only, with reference to the accompanying schematic drawings in which:

FIGS. 4a and 4b depict a comparison between a standard learned feed-forward signal and a time adaptive learned feed-forward signal (in incremental units);

DETAILED DESCRIPTION OF THE INVENTION

Figure 1A:
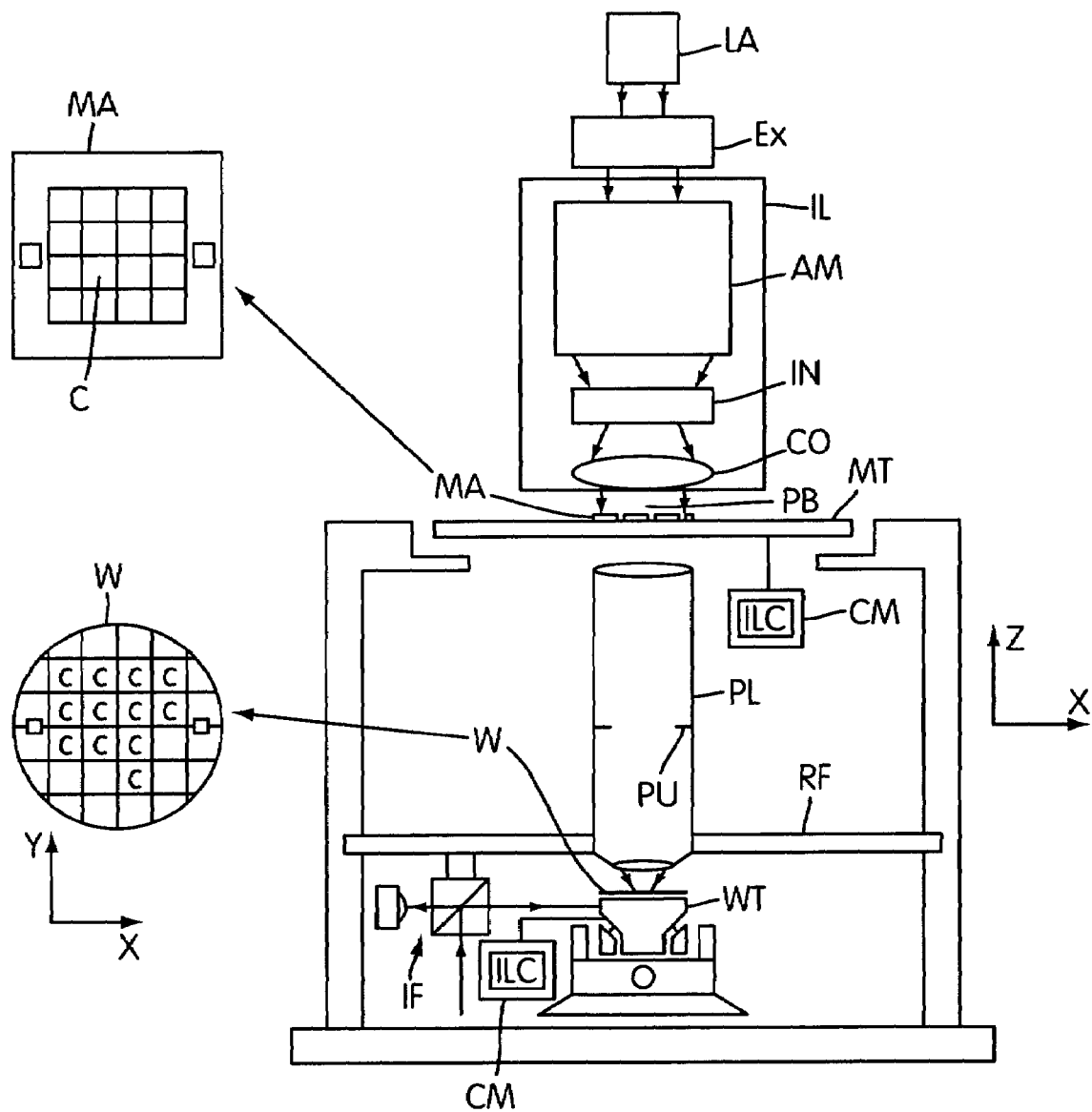
FIG. 1a depicts a lithographic projection apparatus embodying the invention.

FIG. 1a depicts a lithographic projection apparatus embodying the invention. The invention is not however limited in this respect. The present invention has application to any process or system, which is to be controlled over a setpoint trajectory.

In the following detailed description, which references lithographic systems as an example of an application of the present invention, the following remarks should be kept in mind: the term "patterning device" as here employed should be broadly interpreted as referring to a device that can be used to impart an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning devices include:

a mask: the concept of a mask is well known in lithography, and it includes mask types such as binary, alternating phase-shift, and attenuated phase-shift, as well as various hybrid mask types. Placement of such a mask in the radiation beam causes selective transmission (in the case of a transmission mask) or reflection (in the case of a reflective mask) of the radiation impinging on the mask, according to the pattern on the mask. In the case of a mask, the support structure will generally be a mask table/holder, which ensures that the mask can be held at a desired position in the incoming radiation beam, and that it can be moved relative to the beam if so desired;

a programmable mirror array: one example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as non-diffracted light. Using an appropriate filter, the non-diffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation mechanism. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described here above, the patterning device can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the support structure may be embodied as a frame or table, for example, which may be fixed or movable as required; and a programmable LCD array: an example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table/holder; however, the general principles discussed in such instances should be seen in the broader context of the patterning device as set forth here above.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate table/holders (and/or two or more mask table/holders). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and U.S. Ser. No. 09/180,011, filed 27 Feb. 1998 (WO 98/40791), incorporated herein by reference.

In general, a single wafer will contain a whole network of adjacent target portions that are successively irradiated via the projection system, one at a time. In current apparatus, employing patterning by a mask on a mask table/holder, a distinction can be made between two different types of machine. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table/holder parallel or anti-parallel to this direction. Since, in general, the projection system will have a magnification factor M (generally <1), the speed V at which the substrate table/holder is scanned will be a factor M times that at which the mask table/holder is scanned. More information with regard to lithographic devices as here described can be gleaned, for example, from U.S. Pat. No. 6,046,792, incorporated herein by reference.

In a manufacturing process using a lithographic projection apparatus according to the invention a pattern (e.g. in a mask) is imaged onto a substrate that is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer.

If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The illumination system may also include components operating according to any of these design types for directing, shaping or controlling the projection beam of radiation, and such components may also be referred to below, collectively or singularly, as a "lens". Further, the lithographic apparatus may be of a type having two or more substrate table/holders (and/or two or more mask tables). In such "multiple stage"

devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm), as well as particle beams, such as ion beams or electron beams.

The lithographic apparatus shown in FIG. 1a comprises:
an illumination system Ex, IL: for supplying a projection beam PB of radiation (e.g. EUV, DUV, or UV radiation). In this particular case, the radiation system also comprises a radiation source LA;
·a first object table (mask table/holder/holder) MT: provided with a mask holder for holding a mask MA (e.g. a reticle), and connected to first positioning mechanism for accurately positioning the mask with respect to item PL;
a second object table (substrate table/holder/holder) WT: provided with a substrate holder for holding a substrate W (e.g. a resist-coated silicon wafer), and connected to second positioning mechanism for accurately positioning the substrate with respect to item PL;
·a projection system ("lens") PL: for example, a mirror or refractive lens system that images an irradiated portion of the mask MA onto a target portion C (comprising one or more dies) of the substrate W; and
a control mechanism CM: for controlling the position of either the first or second object table with respect to the projection beam or patterned beam, respectively. The control mechanism includes an iterative learning control mechanism ILC. The control mechanism is described in further detail hereinbelow with reference to FIGS. 2 to 8.

As depicted in FIG. 1, the apparatus is of a transmissive type (i.e. has a transmissive mask). However, as depicted in FIG. 2, it may also be of a reflective type, for example (with a reflective mask). Alternatively, the apparatus may employ another kind of patterning device, such as a programmable mirror array of a type as referred to above.

The source LA (e.g. a mercury lamp, a Krypton-Fluoride excimer laser or a plasma source) that produces a beam of radiation. This beam is fed into an illumination system (illuminator) IL, either directly or after being passed through conditioning mechanism, such as a beam expander Ex, for example. The illuminator IL may comprise adjusting mechanism AM for setting the outer and/or inner radial extent (commonly referred to as σ-outer and σ-inner, respectively) of the intensity distribution in the beam. In addition, it will generally comprise various other components, such as a condenser CO and an integrator IN. The integrator IN projects the incoming light into the condensor CO. The integrator IN may, for example, be formed of a quartz rod, and is used to improve the intensity distribution of the beam to be projected over the cross section of the beam. The integrator thus improves the illumination uniformity of the projection beam PB. In this way, the beam PB impinging on the mask MA has a desired uniformity and intensity distribution in its cross-section.

It should be noted with regard to FIG. 1a that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning mechanism PW (and interferometric measuring mechanism IF), the substrate table/holder WT can be moved accurately, e.g. so as to position different target portions C in the path of the beam PB. Similarly, the first positioning mechanism PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module and a short-stroke module, which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in different modes:
step mode: the mask table MT is kept essentially stationary, and an entire mask image is projected in one go (i.e. a single "flash") onto a target portion C. The substrate table/holder WT is then shifted in the X and/or Y directions so that a different target portion C can be irradiated by the beam PB;
scan mode; essentially the same scenario applies, except that a given target portion C is not exposed in a single "flash". Instead, the mask table MT is movable in a given direction (the so-called "scan direction", e.g. the Y-direction) with a speed v, so that the projection beam PB is caused to scan over a mask image; concurrently, the substrate table/holder WT is simultaneously moved in the same or opposite direction at a speed V=M v, in which M is the magnification of the lens PL (typically, M=¼ or ⅕). In this manner, a relatively large target portion C can be exposed, without having to compromise on resolution; and
other mode: the mask table MT is kept essentially stationary holding a programmable patterning device, and the substrate table/holder WT is moved or scanned while a pattern imparted to the projection beam is projected onto a target portion C. In this mode, generally a pulsed radiation source is employed and the programmable patterning device is updated as required after each movement of the substrate table/holder WT or in between successive radiation pulses during a scan.

This mode of operation can be readily applied to maskless lithography that utilizes programmable patterning device, such as a programmable mirror array of a type as referred to above.

Controllers for controlling the position of either the support structure or the substrate table/holder are known. However, conventional controllers suffer various drawbacks. For example, with reference to lithographic apparatuses, the setpoint trajectory includes an exposure interval. During the exposure interval, the stage is controlled to move at a constant velocity for step and scan. Servo errors must lie within certain acceptable bounds for the exposure interval.

Figure 1B:
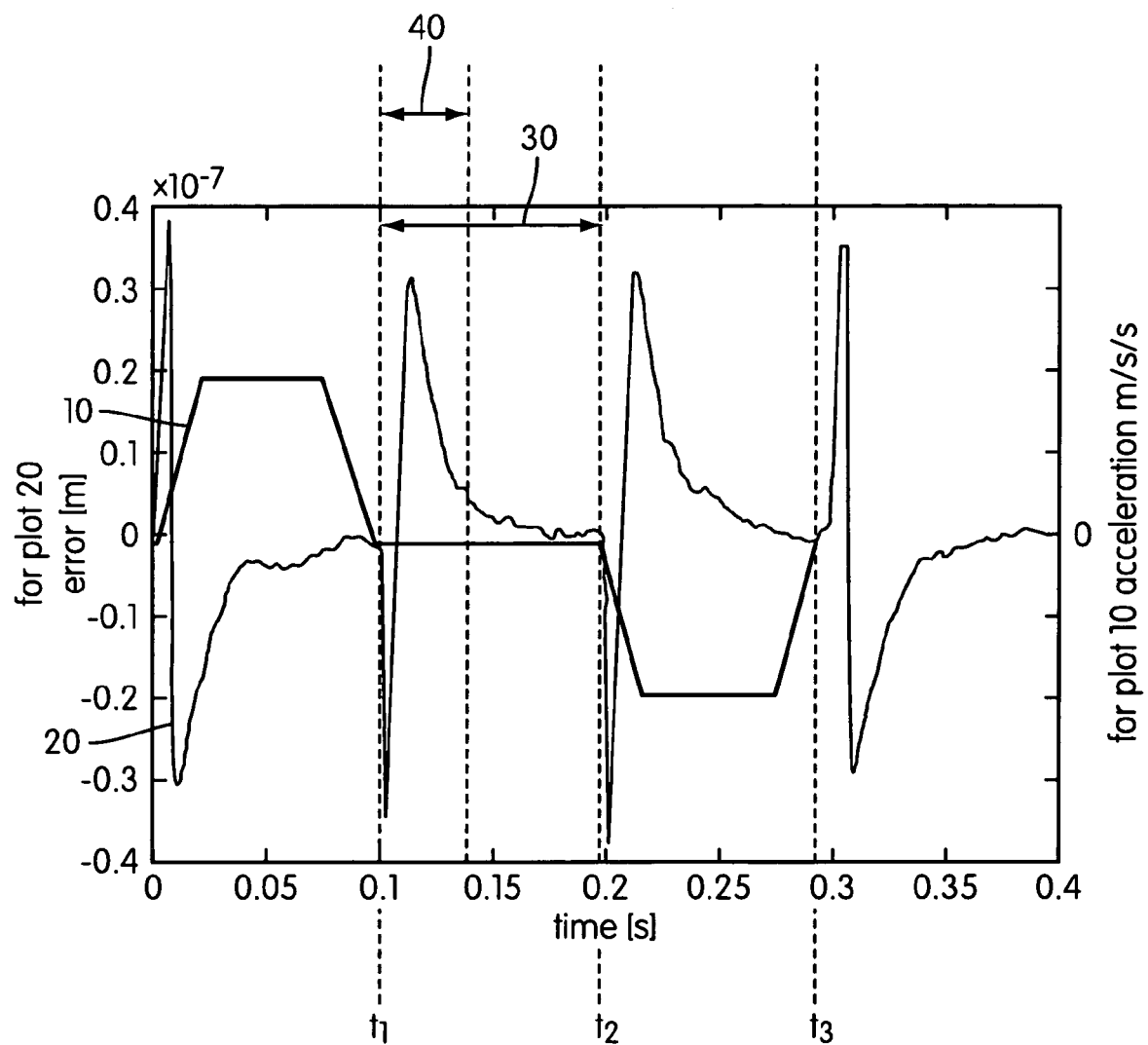
FIG. 1b depicts a typical setpoint trajectory and error signal to which the present invention may be applied.
Figure 2:
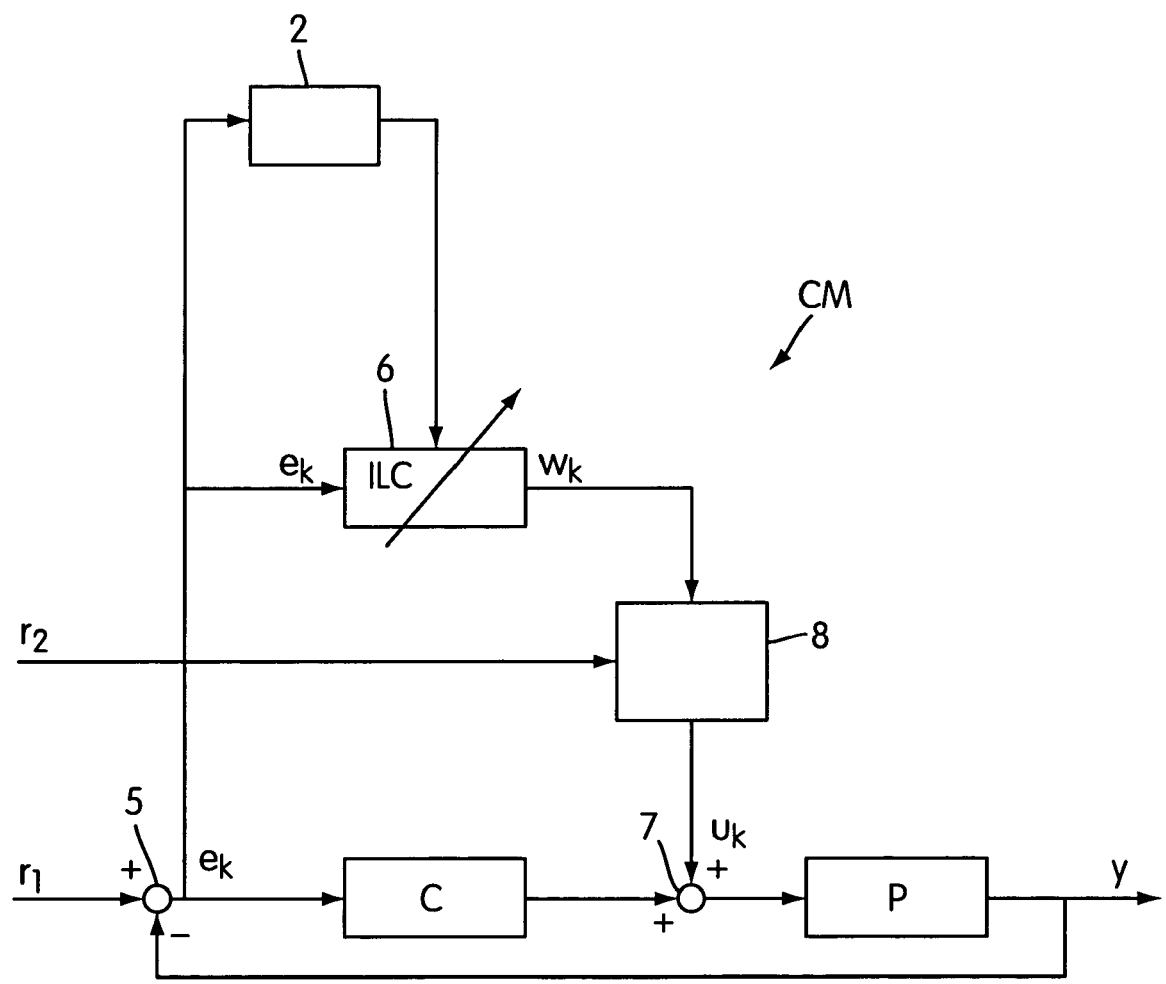
FIG. 2 depicts a control block diagram according to an embodiment of the present invention.

Using conventional feedback and feedforward control (i.e. non-iterative learning control techniques), it is known that position errors exceed specifications during and directly after acceleration to constant velocity, as denoted in FIG. 1b as time t1. To accommodate this in conventional apparatuses, a settling time is necessary to let the error settle to within the acceptable bounds before actual exposure starts. Waiting for the settle time limits productivity (throughput) and therefore, elimination of the settle time is a significant productivity benefit. Conventional control techniques fail to eliminate this problem.

Due to the reproducible character of the settle behaviour, iterative learning control (ILC) techniques are effective in eliminating this error contribution and therefore, help to establish a so-called "zero" settling (that is a zero settling time where exposure is started directly at the end of the acceleration phase). In iterative learning control, the learned feed-forward signal depends on the particular setpoint (the scanning profile). Thus, each time the scanning profile is changed, i.e. the setpoint r is changed, for example when the length of the illumination interval varies, the learning process has to be repeated and consequently, the learned feed-forward signal uk has to be redesigned. Thus, if scans with different lengths are to be carried out, but with identical acceleration phase of the trajectory, in conventional iterative learning control, learning must be repeated, which reduces the productivity since learning costs time and expertise during which wafer exposure cannot take place.

According to an aspect of the present invention, a technique for scan length independent control using iterative learning control is proposed, wherein the same learned feed-forward signal can be applied to a range of possible scan lengths provided that the acceleration phase remains unchanged. The present invention has application in a lithography apparatus to control the movement of at least one of the support structure and/or the substrate table/holder along a trajectory. In one embodiment, the movement of at least one of the support structure and/or the substrate table/holder is controlled according to a trajectory determined with respect to a fixed reference. In an alternative embodiment of the present invention, the support structure and the substrate table/holder are controlled to move simultaneously, wherein the trajectory of the support structure and the substrate table/holder is determined on the basis of a relative movement between the support structure and the substrate table/holder, wherein the learned feed-forward signal is used to control the relative movement of the support structure with respect to the substrate table/holder, so as to project the patterned beam onto a target portion of the substrate in a desired manner.

FIG. 1b shows a typical setpoint trajectory to which the present invention may be applied. A plot of a typical acceleration 10 associated with a particular scanning profile, i.e. the second derivative with respect to time of the scanning profile, is shown, wherein acceleration in m/s/s is plotted against time. During operation, the maximum acceleration is typically in the region of 5 m/s/s. FIG. 1b also shows a plot 20 of the associated servo error under conventional feedback and feed-forward control signal plotted against the same time period over which the scanning profile has been applied. In FIG. 1b, the acceleration profile is shown to provide information where the stage is moving with constant velocity, i.e. with zero acceleration. t1 denotes the end of the acceleration phase, the interval [t1,t2] denotes the scanning interval, where t_scan=t2−t1, that is the interval during which illumination takes place. The interval [t2,t3] denotes the deceleration phase, where t_deceleration=t3−t2. t3 represents the end of the set point, r. It can be seen from the plot 20 that the settling behaviour exhibited at the end of the acceleration phase under standard feed-forward control at time, t1, and at the beginning of the deceleration phase at time, t2, is not good.

In contrast, the present invention obtains very good servo errors (tracking errors) during the time interval 30 where the stage moves with constant velocity, that is within the time interval [t1,t2]. The motion system shows a settling behaviour, that is for a certain time after time instant t1, as shown by interval 40, the servo error is still large. For example, an illumination interval starting with t1=0.1 s having very high accuracy, for example, having a servo error smaller than $0.05 \times 10^{-7}$ m, that is t=0.1 s to t=0.15 s, it is observed that approximately 0.15 s must be waited in order to be able to scan while achieving a servo error of less than $0.05 \times 10^{-7}$ m. It has been found that using ILC in control of a stage in a lithographic apparatus improves the settling behaviour, that is the servo error is smaller in the beginning and end of the illumination interval. The error signal in FIG. 1b was obtained using standard acceleration feedforward control.

As noted above ILC is employed as a feed-forward control for motion systems that repeatedly perform the same movement to eliminate repeating or periodic deterministic positioning errors while shortening settling times. However, it has been found that ILC amplifies non-periodic deterministic disturbances and stochastic disturbances, such as noise, in the control signal. Further, the learning process takes up considerable processing time during which the process or system is not operational. For this reason, prior to the present invention, ILC was not considered as a viable option for the control of supports in lithographic apparatuses because in lithography control is required to take place over a variety of setpoints, corresponding to differing die or reticle image sizes. Prior to the present invention, the time it would take for the control system to learn the feed-forward signal for each die or reticle size was prohibitive.

The present invention provides a solution to the above problems. In a lithographic projection apparatus, the present invention has particular application to controlling either the wafer stage or the reticle stage or both. One of the components of the wafer scanner is the six degrees of freedom wafer stage. The wafer stage is an electro mechanical servo system that positions the wafer with respect to the imaging optics. Typically, the wafer has a diameter of 200–300 mm. The control of the wafer stage largely determines the throughput and the accuracy of the products and is subject to severe performance requirements. Typical throughputs are of the order of 80–100 wafers per hour, with approximately 80–200 integrated circuits per wafer. Typical scan speeds and decelerations are 0.6 meters per second and 10 meter per second per second, respectively. The positioning accuracy is in terms of nanometers and microradians. Such high accuracy is needed regarding the fine patterns to be produced. Typical feature dimensions are of the order of 180–250 nanometers. Moreover, various layers, typically 20 layers, of different patterns have to be aligned very accurately with respect to each other.

FIG. 2 depicts a control block diagram according to an embodiment of the present invention. In particular, FIG. 2 shows an iterative learning control system (ILC) including an adaptive filter according to the invention. A conventional iterative learning controller and the iterative learning controller of the present invention comprise two filters: a learning filter L and a robustness filter Q. The learning filter L of the present invention does not have to differ from a conventional learning filter. However, in conventional iterative learning controllers the robustness filter is fixed, in contrast to the present invention, where the robustness filter Q is an adaptive time varying filter as will be described below.

In FIG. 2, P indicates a process or a system to be controlled. The motion system includes the process to be controlled P, which for the lithographic application includes analog to digital and digital to analog converters, an actuator system and a sensor system, or in other words includes mechanics, software and electronics, an input of the plant, which in the lithographic application is a force which is going to move the system, and an output signal, which in the lithographic application gives the position when the system is moved. Therefore, the signal y gives, at each moment, the position of the plant to be controlled. A feedback controller C functions conventionally to provide a feedback control signal to the process P.

The signal y is supplied via a feed back loop to a summer 5. A setpoint signal r1 is supplied to the summer 5. The setpoint signal r may be defined as being the trajectory the motion system has to follow. And, although not essential, the setpoint signal r may be further defined as the motion the system has to follow to complete one movement from stand still to stand still. In the case of a lithographic apparatus, the setpoint signal r is the trajectory the substrate table/holder, that is the wafer or mask stage has to follow to make one exposure, wherein illumination takes place during the interval in which the substrate table/holder, such as the wafer or reticle stage, travels at constant velocity. In other words, the substrate table/holder has to follow the setpoint.

The summer 5 determines an error signal ek indicative of the deviation between the output signal y and the set point signal r1, that is ek=r−y. The error signal ek represents the servo error developed during the "kth" iteration. ILC derives a next value e(k+1), in which the undesired effects observed in the error signal ek are suppressed. Theoretically, when ILC is applied to a process in which only periodic deterministic disturbances occur, the servo error for increasing values of k reduces to zero. In practice, however, a variety of stochastic and non-periodic deterministic effects occur in the system, which cannot be learned due to their unpredictable nature. Thus, after applying the ILC procedure a number of times, it is observed that the servo error ek is not further improved after subsequent iterations. At this point in practice, the ILC procedure is stopped.

The ILC element 6 in FIG. 2 is designed to iteratively provide a feed-forward signal uk (where k is the trial index), which controls the repetitive disturbances in the servo error ek. Thus at iteration k, i.e. when the learned feed-forward signal uk is applied, the error ek is obtained and analysis element 2 analyzes the error signal ek obtained at iteration k.

The error signal ek is supplied to an input of a control circuit including feedback controller C. In addition, the error signal ek is supplied to the iterative learning control element 6, an analysis element 2, and a signal modification unit 8, which modifies the learned feed-forward signal according to a different setpoint signal r2. The feed-forward signal uk generated by the iterative learning control circuit is supplied via the summer 7 to the output of the feedback controller C, to control the process P.

The ILC element 6 in FIG. 2, as mentioned above, comprises two filters: a standard learning filter and an adaptive robustness filter. The learned feed-forward signal uk includes amplified stochastic and non-periodic deterministic disturbances. After iteration k, that is, after implementing the learned feed-forward signal uk, the analysis element 2 analyzes a parameter of the servo error ek. The parameter may be any parameter that yields information about the nature of the servo error, such as, for example, the energy or amplitude. In the examples discussed, the parameter of energy is taken. However, the invention not limited in this respect, and energy is taken by way of example only.

Analysis element 2 analyzes the parameter in order to distinguish where in time and frequency the deterministic energy is located in the error signal ek (which may be periodic or non-periodic) and where in time and frequency the stochastic effects are present in the error signal ek. That is, the analysis element 2 carries out time frequency analysis, which analyzes time locality and frequency spectra in a energy plot of the chosen parameter, for example an energy or amplitude plot, of the servo error signal ek, for a given predetermined value k. On the basis of this analysis, the stochastic and non-periodic deterministic disturbances, such as noise, are identified.

It has been found that the characteristics of the deterministic components differ from those characteristics of a stochastic disturbance component. In particular, an energy plot of the analyzed error signal ek, shows that the energy of a deterministic disturbance over a particular time interval differ from the energy of a stochastic disturbance over the same time interval. That is, the energy of the non-deterministic disturbance component has a smaller magnitude than the energy of the deterministic disturbance component. When the system is in operation, for example, when the stage is moving, the high energy deterministic components are concentrated around the jerk moments, which correspond primarily to the acceleration and deceleration intervals, at the beginning and the end, respectively, of the illumination interval, around the time instants t1 and t2 in FIGS. 1a and 7a. Thus, the analysis element 2 identifies where in time, there are deterministic components and where not. The adaptive filter Q filters the current feed-forward signal such that effectively ILC is active only when the deterministic components of the error signal are predominant.

The deterministic components include repetitive dynamic attributes. The expression "repetitive" is well known in the art of control engineering and is understood to mean that if the same task is applied to a system or process, the behavior of that system or process reproduces. The level of the repetitive dynamic may vary from relatively small to relatively large. The present invention has particular application to dealing with significant repetitive dynamics. By "significant" it is meant those dynamic attributes whose level is higher than those of random noise.

The adaptive filter Q effectively changes its bandwidth (cutoff frequency) as a function of time and the dynamics which cause certain deterministic components, including the repetitive dynamic attributes, of the error signal to be incorporated into the learning feed-forward controlled process at the appropriate time instants. That is, the filter opens to allow the repetitive dynamic attributes exhibited by the system or process to be incorporated into the learned feed-forward signal at the appropriate time instants for controlling the system or process.

It is noted that the deterministic, including repetitive dynamics may be high frequency dynamics. However, depending on the particular dynamic they may not be high frequency. The invention is not limited to dealing with high frequency dynamics. The adaptive filter Q is opened sufficiently (i.e. has a high cut off frequency) to allow repetitive dynamics to enter the learning process. In fact, the time frequency analysis reveals how high the deterministic contributions are at which moment in time, so as to open the filter just as much is as needed to learn what can be learned, and thereby minimize the deteriorating impact of unwanted noise amplification.

The bandwidth of the filter is reduced when the system dynamics do not exhibit high levels of deterministic components so that the stochastic components do not enter the learned feed-forward signal, and thus, it avoids noise amplification when applying learning feed-forward control. Therefore, the adaptation of the filter bandwidth will adjust the bandwidth frequency as a function of time (for a given setpoint, time is strongly related or coupled to position) to maximize the tracking performance while still maintaining a good noise performance. In particular, the adaptive filter Q is designed to filter out the stochastic components of the error signal, so that they do not enter the learned feed-forward signal. The adaptive filter Q may be realized in the form of a low pass filter whose cutoff frequency varies according to the current frequency content present in the error signal.

The output from the analysis element 2 is input to the adaptive filter Q. The filter is designed to have a predetermined threshold. In short, the adaptive filter identifies whether there is a something to be learned from the error signal. If, for example, the error signal is analyzed as including periodic deterministic errors, the filter will then "turn on" the learning process, that is the bandwidth of the adaptive filter Q is increased, thus ensuring that those periodic deterministic disturbances are learned in order for them to be corrected for.

If, on the other hand, the error signal is analyzed as including predominant stochastic or non-periodic deterministic disturbances, the filter will then "turn off", or "turn down", the supply to the iterative learning filter L, since there is nothing to learn from these errors because they are random in the case of stochastic errors, or non repeating, as in the case of the non-periodic deterministic disturbances. It is desired to keep the deterministic components, in particular the periodic disturbance components in the ILC error signal ek, because, as mentioned previously, learned feed-forward signal uk is adapted to suppress or eliminate the periodic disturbances. In particular, the information in the error signal ek aids the construction of an effective feed-forward signal, such that the repetitive errors can be eliminated. The adaptive ILC of the present invention, generates a learned feed-forward signal uk which compensates in an intelligent way for the repeating disturbances: when there are deterministic components in the disturbances to be learned, the feed-forward signal uk accounts for them, when there are mainly stochastic components the feed-forward signal uk does not learn them, and thus, it does not amplify them. By analyzing the components of the disturbances in the error signal ek, adaptively filtering the error signal ek, the problem of noise amplification when ILC is applied is addressed.

Figure 3:
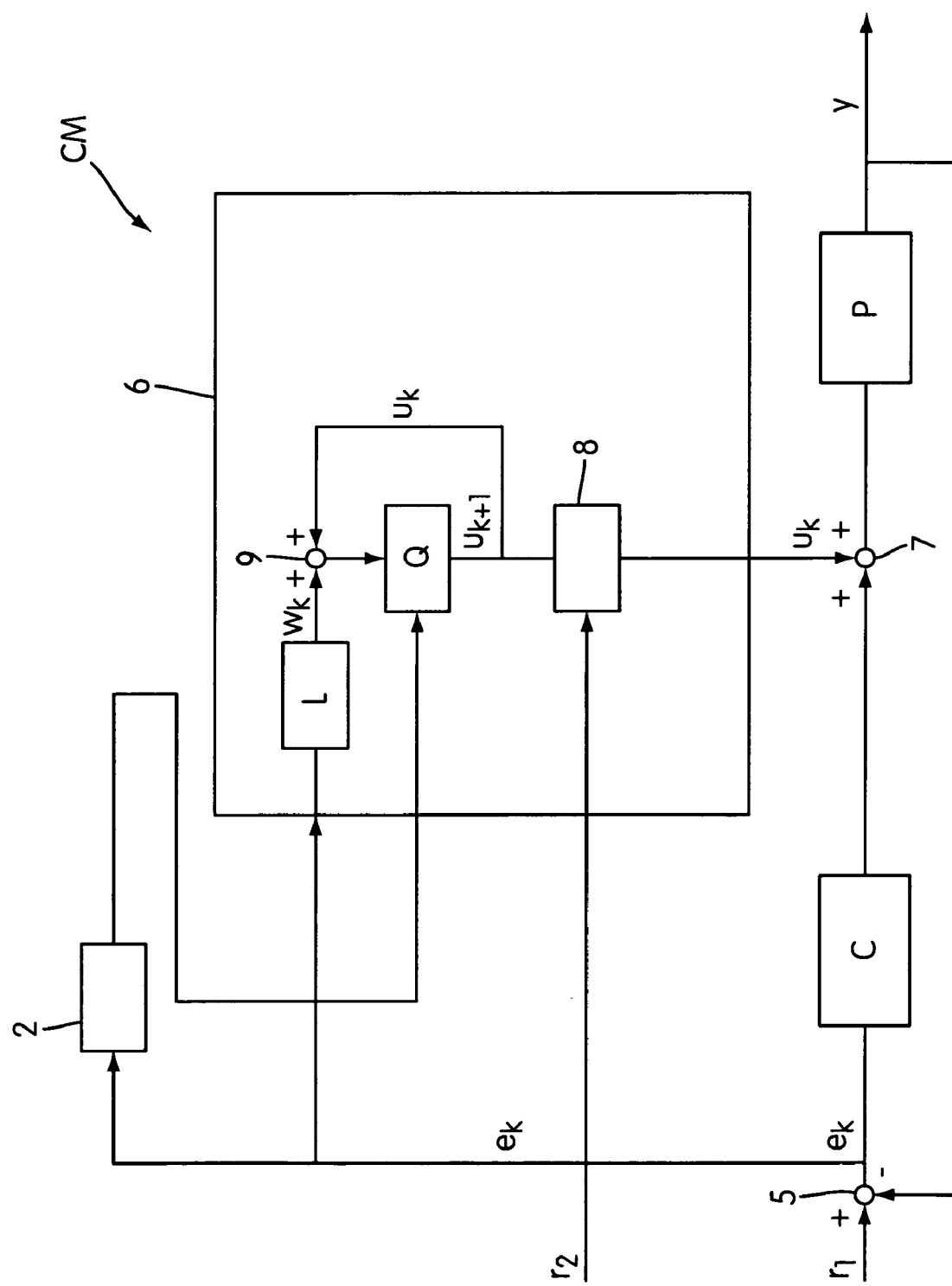
FIG. 3 depicts further details of the controller depicted in FIG. 2.

FIG. 3 depicts further details of the control mechanism depicted in FIG. 2. Those elements shown in FIG. 3 corresponding to the same elements in FIG. 2 are not described further. As discussed above, ILC is based on the principle of using an already obtained servo error ek in order to design an ideal input, or learned feed-forward signal uk, to reduce the servo error ek, which thus improves the tracking error of a system. The ILC control mechanism 6 comprises the learning filter L and the adaptive filter Q. Preferably, the adaptive filter is a robustness filter. The output of the learning filter L, wk, which represents the filtered learned error signal, is added at summer 9 together with the output of the adaptive filter Q, which is the already implemented learned feed-forward signal uk. Also provided in the ILC element 6, is a signal modification unit 8 for modifying the feed-forward signal uk output from the adaptive filter Q to control a process over a second setpoint r2 having a second, different scan length. This aspect is described in more detail below.

FIGS. 4a and 4b depict a comparison between a standard learned feed-forward signal and a time adaptive learned feed-forward signal (in incremental units) plotted against time. The example relates to the control of a moveable stage, the increments relate to Newtons (unit of force) by a certain factor. The acceleration feed-forward 60 has a sharp rise time, followed by a constant velocity, followed by a sharp deceleration time. The adaptive feed-forward signal 61 follows the sharp rise time. It is seen that for the period of the scanning interval where the system moves at a constant velocity, the feed-forward signal is smooth, and has a zero value. A conventional (standard) learned feed-forward signal 62, shown in FIG. 4b, corresponding to the same acceleration feed-forward profile exhibits amplified noise in the constant velocity portion of the graph, which the present invention eliminates.

As seen in FIGS. 4a and 4b, unlike the standard ILC feed-forward, the time frequency adaptive feed-forward exhibits dynamics only in the beginning and at the end of the scanning interval. Between these intervals the feed-forward signal is smooth, having approximately zero values. Therefore, as further described below, when the scan length changes, as is shown in FIG. 5, learning does not have to be performed again.

Figure 6A:
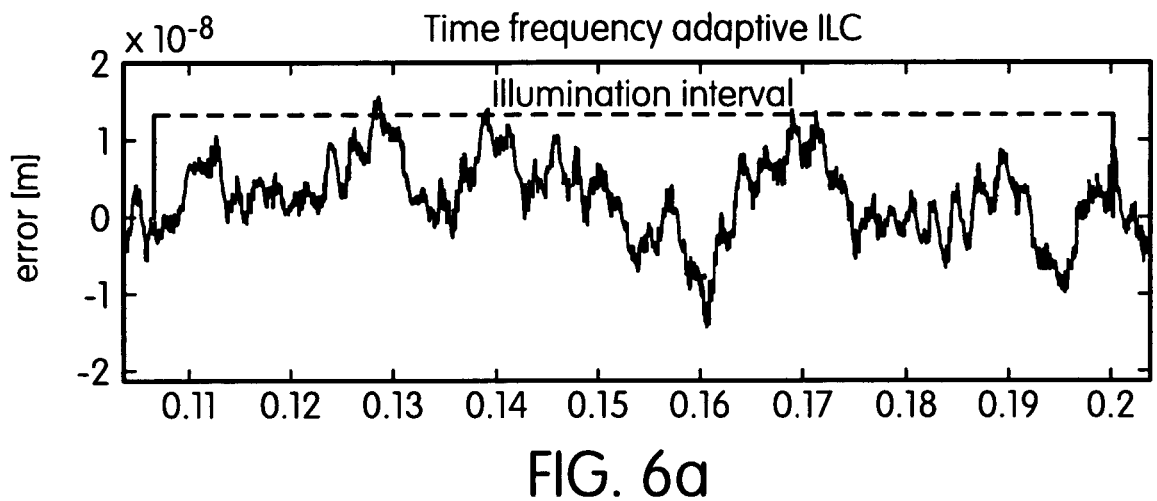
FIGS. 6a and 6b depicts a comparison between a time frequency adaptive ILC error signal and a standard ILC error signal.
Figure 6B:
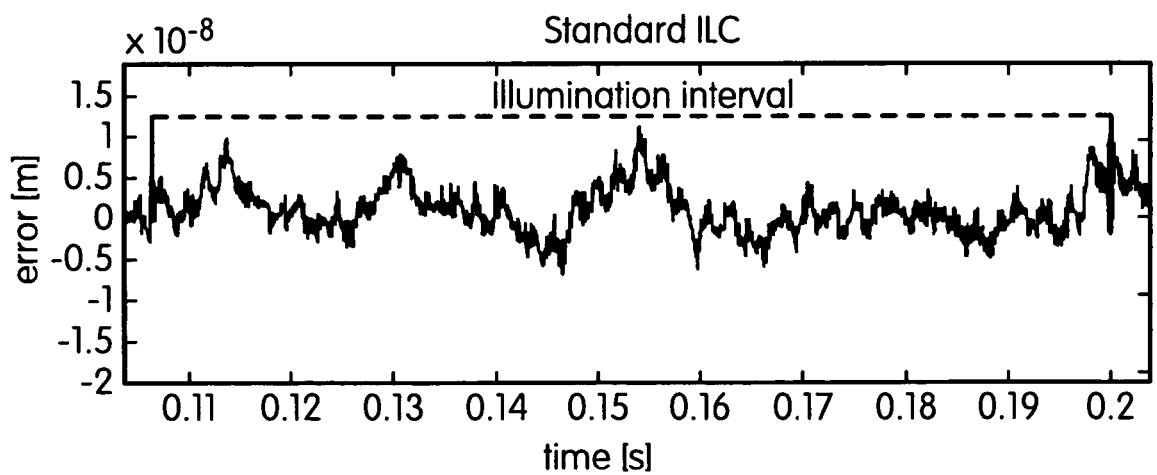

FIGS. 6a and 6b show a further comparison between a time frequency adaptive ILC and a standard ILC. FIG. 6a depicts the servo errors in a scan whose feed-forward signal has been designed using the adaptive filter of the present invention where the feed-forward signal includes additional zero values for the interval of constant velocity. It is seen with comparison to FIG. 6b which shows the servo error for a standard ILC designed feed-forward error, that a feed-forward signal comprising additional zeros for the constant velocity interval of the setpoint trajectory does not produce an increased the error signal.

Figure 5:
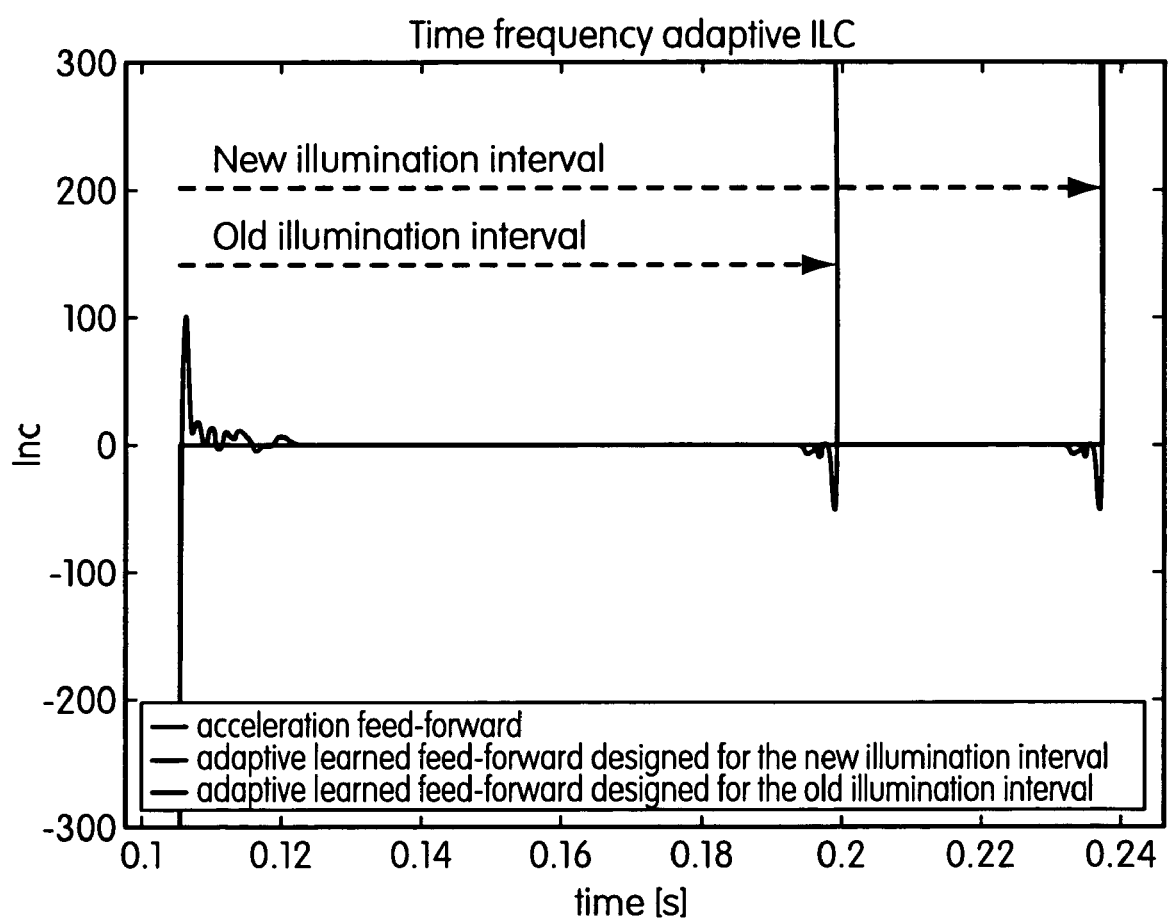
FIG. 5 depicts the learned feed-forward signal for different scan intervals before and after modifying according to the desired new scan length.

As illustrated in FIG. 5, the adaptive Q filter in fact enables a further aspect of the invention, namely, to provide a scan length independent learning feed-forward signal, which provides the advantages of the performance of the ILC without the need to repeat the time consuming learning process for different setpoints (which corresponds to different die sizes in the lithography application of the invention).

Based on the insight that adaptive ILC gives, namely, the insight that only at the beginning and at the end of the setpoint trajectory, for example, as shown in FIG. 1b, where acceleration respectively, deceleration, takes place, deterministic system or process dynamics, including repetitive dynamics, are predominant. Therefore, only over these intervals does ILC need to be performed. Thus, a scheme may be developed for developing a feed-forward signal for different scan lengths, which otherwise have the same dynamics at the beginning and the end. In particular, by means of the time frequency analysis it has been observed that there is not much to be learned during the constant velocity interval of the setpoint trajectory (except from the phase directly following the acceleration or deceleration phase where the system behaviour needs to settle). By adapting the Q filter during the application of the adaptive ILC procedure, according to the obtained insight in the amount of repetitive behaviour in the tracking error along the setpoint trajectory, the repetitive error contributions can be eliminated where present while avoiding noise amplification for those intervals where repetitive contributions are absent or negligible.

Further, the learned feed-forward signal obtained with the adaptive ILC procedure of the present invention, typically comes to rest (that is a smooth instead of a noisy signal is observed, refer to FIG. 4a in comparison to FIG. 4b) during the constant velocity interval of the scanning motion. Thus, by inserting values in the learned feed-forward signal corresponding to values as present in the smooth interval, which are typically zero values (refer to FIG. 4a) a learned feed-forward signal can be constructed that can be used for elongated scan lengths (provided the acceleration and deceleration phases remain unchanged) providing the same amount of tracking performance improvement as obtained by applying adaptive ILC for the original scanning movement without having to repeat the adaptive ILC procedure for those elongated scan lengths, refer to FIGS. 6a and 6b.

Further, the same holds for modifying the learned feed-forward signal for shorter scan lengths. In such an embodiment, intervals are eliminated from the smooth segment of the learned feed-forward signal so as to obtain the same ILC like tracking performance for scans of shorter length than the original scanning movement (again provided the acceleration and deceleration phases remain unchanged) without having to repeat the adaptive ILC procedure for those shortened scans.

Thus, according to this aspect of the invention, by "cutting" or "pasting", as appropriate, smooth intervals of desired length from the original learned feed-forward signal obtained using the adaptive ILC procedure of the present invention, the tracking performance improvement obtained by adaptive ILC has become scan-length independent. With respect to this particular aspect of the present invention, it is commented that the setpoint trajectories may only differ in respect of the those intervals where there are no repetitive system dynamics which may give rise to deterministic components in the error signal. Thus, for the particular example of the scan lengths, the setpoint trajectories may only differ in the scan length from one another, that is for that interval of the setpoint trajectory where the velocity is constant, one setpoint trajectory has a shorter or longer interval than the further setpoint trajectory. However, for this particular aspect, the acceleration part and deceleration part of both setpoint trajectories are identical Further, time frequency analysis has provided the insight that it is often the case that there is not much to be learned during the majority of the constant velocity interval because at constant velocity there are no large repeating tracking error contributions to be observed, except directly after the end of the acceleration phase and where settling behavior exceeds specifications without applying ILC.

As previously described, the appropriate adaptation of the filter characteristics, based on the insight obtained from the time-frequency analysis, noise amplification is avoided for that section of the learned feed-forward signal resulting in a very smooth feed-forward signal for that section. Typically, feed-forward signal values are around the 0 value for the wafer and reticle stages. After applying ILC to a setpoint trajectory having a first length a learned feed-forward signal is available. For a scan of different length a second, different setpoint trajectory will be generated with the only difference compared to the in first (available) setpoint trajectory (the one that ILC has been applied to and has resulted in an appropriate learned feed-forward signal) being in terms of the length of the constant velocity interval (i.e. acceleration and deceleration phase are identical).

According to the further aspect of the invention the available learned feed-forward signal is engineered to provide a modified learned feed-forward signal to control the system or process over a second, different setpoint trajectory, by inserting or removing appropriate intervals in the smooth part of the learned feed-forward signal (corresponding to the desired variation of the constant velocity interval of the setpoint trajectory) without violating the smoothness of the learned feed-forward signal. Typically for the case when the learned feed-forward signal smoothly varies in the vicinity of the 0 value, elongation of the scan length can be obtained by inserting segments of 0 value in the smooth part of the constant velocity interval of the learned feed-forward signal.

As a result, applying the adequately tailored learned feed-forward signal, movement along the second, different setpoint trajectory can be performed providing typically the same tracking performance improvement as obtained by the application of ILC to movement along the initial/first setpoint trajectory without having to go to the standard ILC procedure for movement along that particular second, different setpoint trajectory.

Thus, as mentioned ILC needs only to be performed once, and movements along a whole family of scans (with setpoint trajectories only differing in the length of the scanning interval) can be performed with improved or even eliminated settling behavior by modifying (by smoothly adjusting the length of the corresponding constant velocity section) the first available learned feed-forward signal.

Figure 8:
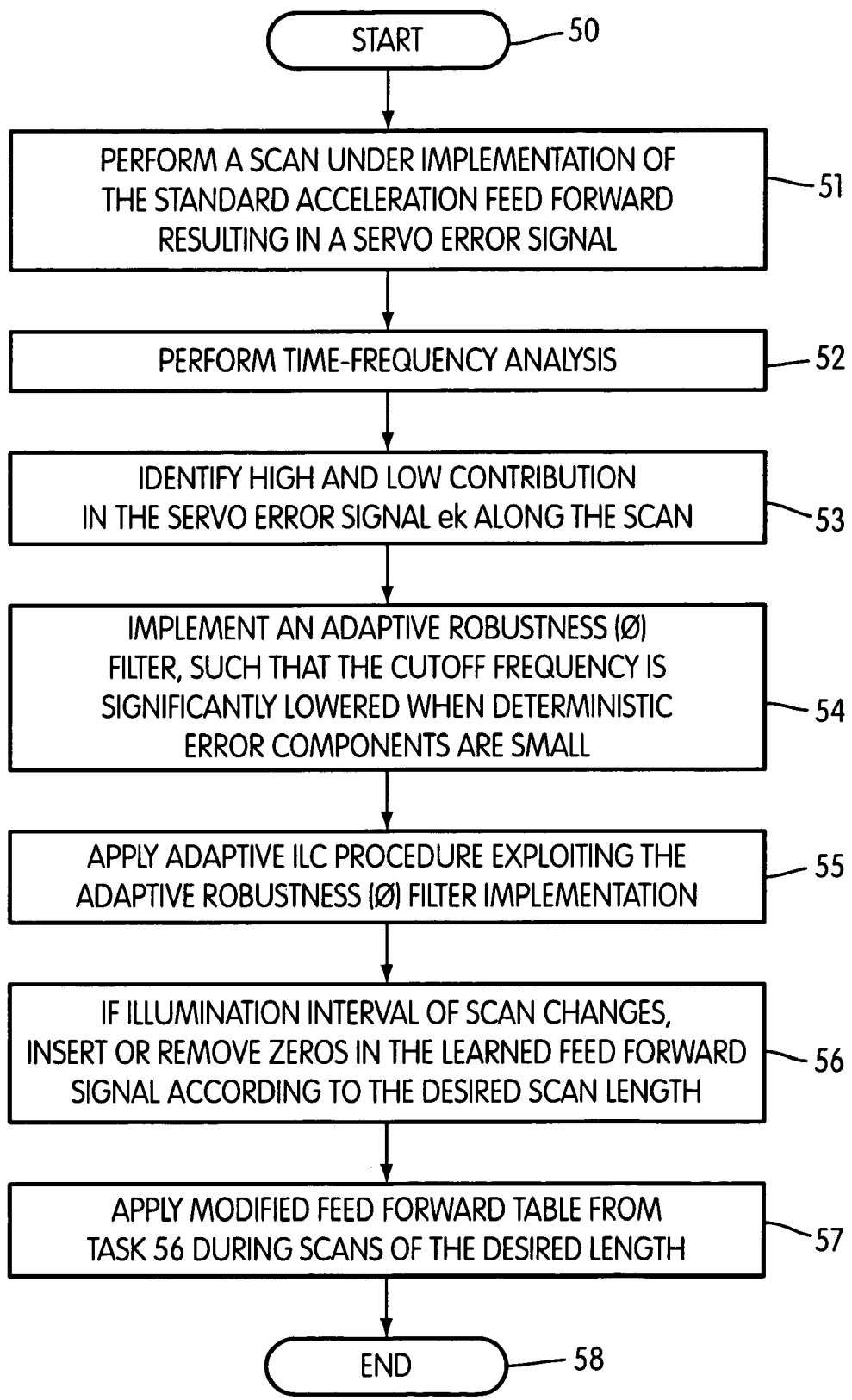
FIG. 8 depicts a flow charts showing the steps carried out according to an embodiment of the invention.

A detailed embodiment is shown in FIG. 8, which depicts a flow chart showing the processing tasks carried out according to an embodiment of the present invention. In particular, the flow chart illustrates a method of the present invention that may be executed by a computer operating according to a computer program embodying the controller. The computer program may be written in a computer language such as matlab, which is implemented in C or C++.

The analysis and adaptive filtering of the present invention, follows the following steps: after starting, (task 50), a standard feed-forward (based on desired rigid body acceleration) using a conventional ILC means is implemented with the available software which allows implementation of any feed-forward signal (task 51).

Time frequency analysis is used (task 52), for example Wigner distribution of the servo error signals of the control signal, to analyse and hence identify, the high and low components of the error signals as well as, for example, their energy levels, in order to be able to determine whether the error signal has periodic, that is deterministic system dynamics at a particular time instant (task 53). The periodic dynamics may be low or high frequency. It is further noted that for a given set point, time and position are strongly related or coupled, or whether the error signal includes non-periodic disturbances, that is noise disturbances.

Instructions are given, which may for example be in the form of a computer program, to the filter which defines the cut off frequency of the time frequency adaptive filter (task 54). As mentioned previously, the filter Q is a low pass filter whose cut off frequency varies according to the current frequency content present in the control signals. The filter effectively changes its bandwidth, i.e. its cut off frequency as a function of time and the repetitive dynamics will enter into the learning feed-forward controlled process at the appropriate time instants. Also, the bandwidth of the filter is reduced when the system dynamics do not exhibit high level frequency components and therefore, it avoids noise amplification when applying learning feed-forward control. Therefore, the adaptation of the filter bandwidth adjusts the bandwidth frequency as a function of time (it being previously noted that for a given set point, time is strongly related or coupled to position) to maximize the tracking performance while still maintaining a good noise performance. The adaptive filter is designed to take into account the nonlinear dynamics, that is the position dependent dynamics, beyond the controller bandwidth.

In this way, the adaptive ILC procedure is applied exploiting the adaptive robustness Q filter implementation (task 55). Task 55 results in a servo error from which repeating error contributions have been eliminated, that is the settling problem solved for this learned scan length. It also provides a learned feed-forward table. If the situation arises where a scan length is desired which is not equal to the scan length of the scan in task 51, sequences of zeros or any other appropriate value such that smoothness of the learned feed-forward signal is not disturbed, are inserted or removed in the learned feed-forward signal according to the desired scan length (task 56). Subsequently, the modified feed-forward table from task 56 is applied to scans of the desired length (task 57).

Steps 56 and 57 provide a solution to the settling problem for the new desired scan length without having to repeat the ILC procedures, that is repeating error contributions are eliminated from the tracking servo/error.

The iteration process is described as follows:

Step 1: acceleration feed-forward is implemented, feed-forward 0. The first servo error e0 is obtained.

Step 2: the servo error e0 is analyzed, the operating parameters of the adaptive Q filter are set, a new feed-forward is obtained, feed-forward 1.

Step 3: feed-forward 1 is implemented. The second error e1 is obtained.

The same process is continued for the error e1 as for the error e0, or in more general terms:

suppose iteration k has been reached, and error ek was obtained, wherein k is an arbitrarily fixed integer.

Step 2k: the servo error ek is analyzed. Now the filters Q and L are already designed. The error ek is filtered as shown in FIG. 2, to obtain a new feedforward ffk.

Step 3k: feedforward ffk is implemented. A new error ek+1 is obtained. It is commented that each iteration is required to go through steps 2 and 3 for the then available information.

It will be understood that although the embodiment described with reference to FIG. 8 uses the example of a scan length, the invention is not limited in this respect. In principle, the invention is applicable to any system or process which may be controlled according to any trajectory. In such cases, the error signal is analyzed in the same way, and variations in the trajectory are dealt with in the same way as described above.

Some theoretical analysis is given below. With respect to time-frequency analysis, reference is made to "K. Groechenig, Foundations of Time-Frequency Analysis, 2001, Birkhaeuser Boston".

As is usually the case in control theory, this analysis is restricted to the case where the plant, i.e. the process P is a causal linear time invariant (LTI) dynamical system P. C is a feed back controller which ensures the stability of the closed loop system.

Suppose that the desired response for setpoint r is defined on the interval (t0, tf), where tf<∞ and the initial conditions are the same at the beginning of each trial k. The goal of ILC design is to produce the signal u*, the feed-forward signal, also referred to as the control signal or input signal, such that r=Pu*. Then a sequence of inputs uk is sought with the property that $\lim_{k \to \infty}$ uk=u*, where the index k is the iteration trial. A prototype update law that implements ILC by updating the past iteration input uk on the basis of the past error is (equation 1):

$$uk+1 = Q(uk+wk) = Q(uk+L \cdot ek)$$

The learning filter L has to approximate the inverse of the modeled process sensitivity function Ps(s)(Ps=P/1+PC). For a proper minimum phase modeled process sensitivity function, its inverse function can be computed and implemented without difficulties. For non-minimum phase plants, a stable approximation of the real inverse is used. The robustness filter Q of the present invention differs from conventional robustness filters in that it is an adaptive filter which is adaptive in response to the analysis element 2. The bandwidth of the filter Q varies over time as explained above. When the error signal ek exhibits deterministic behaviour, the bandwidth of the Q filter is big enough to suppress all deterministic effects, when the error signal ek does not exhibit any deterministic behaviour, the bandwidth of the Q filter is as low as possible.

The analysis element 2 carries out time frequency analysis on the error signal ek. Time frequency analysis is a branch of harmonic analysis. On the applications side, it is known that time frequency analysis deals with problems in signal analysis, communication theory and image processing. Time frequency analysis according to the present invention, may take a variety of forms. For example, the short time Fourier transform provides some information on both time locality and frequency spectra, but the precision of the information is limited (worse than in the case of Wigner Distribution). Here a quadratic time frequency representation is used, which measures how much of the control signal energy during the time period [t, t+deltat] is concentrated in the frequency band [ω+deltaω].

For this invention, the Wigner Distribution has been chosen because it is particularly suitable. Beside the energetic interpretation given above of the Wigner distribution as a joint time frequency energy distribution, there is a correlative interpretation as a joint time frequency correlation function. The complete formal analogy of the deterministic, that is the repetitive or periodic, non-periodic and stochastic, i.e. the random interpretation is clear. It has been found that based on time-frequency analysis, the adaptive Q-filter is designed.

With respect to additional applications of the present invention, it is noted that, using a joint probability density, such as the Wigner distribution provides an analysis element for incorporation with an adaptive filter has applications not only in the electromechanical positioning device field, but to broader fields as well. In the particular example, described below, the time frequency analysis is restricted to learned feed-forward design techniques. It has been found that a time frequency analysis described hereinbelow overcomes some of the problems discussed above. In particular, time frequency analysis eliminates the amplified noise components in the feed-forward signal, which arise as a result of an iterative learning control. It is emphasised with reference to FIGS. 4a and 4b, that the adaptive learned feed-forward signal, as depicted in FIGS. 4a and 4b contains deterministic information only at the beginning and at the end of the illumination interval. The rest of the signal has zero values.

As mentioned, in a preferred embodiment, the time frequency analysis is a Wigner distribution. The Wigner distribution of a signal s at time t and frequency to is defined as follows in equation (2):

$$W(t, \omega) = 1/2\pi \int_{-\infty}^{\infty} s^*\left(t - \frac{1}{2}\tau\right) s\left(t + \frac{1}{2}\tau\right) e^{-j\tau\omega} d\tau$$

where s* is the conjugate of the signal s, which is identical to s for real signals. It has further been found however, that because of its quadratic non-linear form, the Wigner distribution puts non-zero values at time instants when the actual signal is zero. Also, the noise around one time instant could be spread to other parts of the time frequency plane. The appearance of non-zero or noise terms at times or frequencies where they do not exist is called interference or cross terms.

Figure 7A:
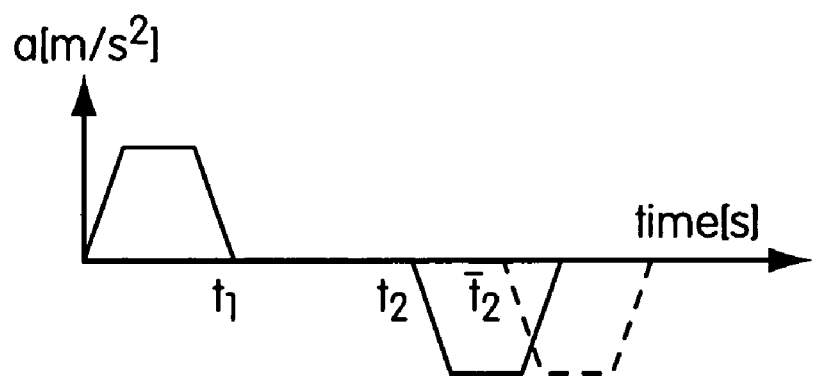
FIG. 7a depicts two accelerations associated with two different scanning profiles for implementation in an embodiment of the present invention.

In the case of the analysis of servo errors with the Wigner Distribution, when applying acceleration feed-forward or ILC, this problem is solved by dividing the compact time interval of the signals to be analyzed in four pieces to minimize the appearance of cross terms. FIG. 7c shows the time interval divided in four pieces t1, t2, t3, T such that the cross terms are eliminated. The choice of the four time intervals depends on the scanning set point profile. For the described system, the acceleration profile shown in FIG. 7a is used, where t1=0.1 s, t2=0.2 s. The Wigner distribution of the control signal u0+w0 is depicted in the three dimensional image shown in FIG. 7b, wherein one axis represents time in seconds, the second axis represents frequency in Hertz, and the vertical axis represents spectral power in nm²/s. The time axis and the frequency axis represent the time frequency (TF) plane.

Figure 7B:
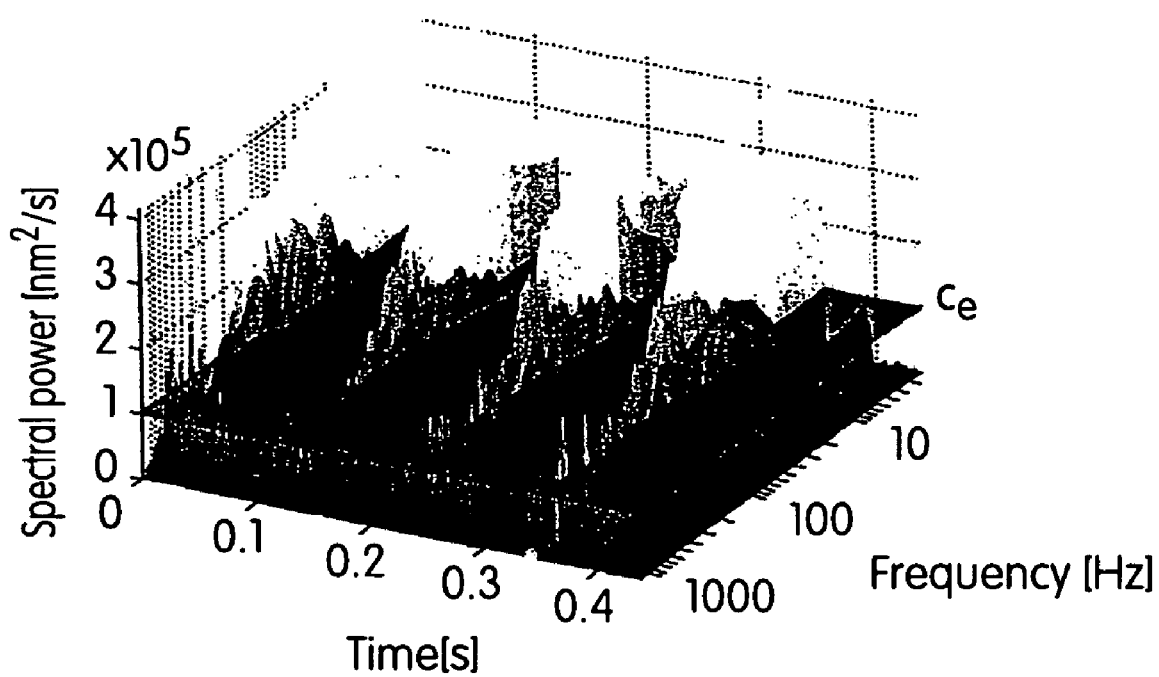
FIG. 7b depicts a graph showing the three dimensional Wigner distribution on the time frequency plane of an error signal.
Figure 7C:
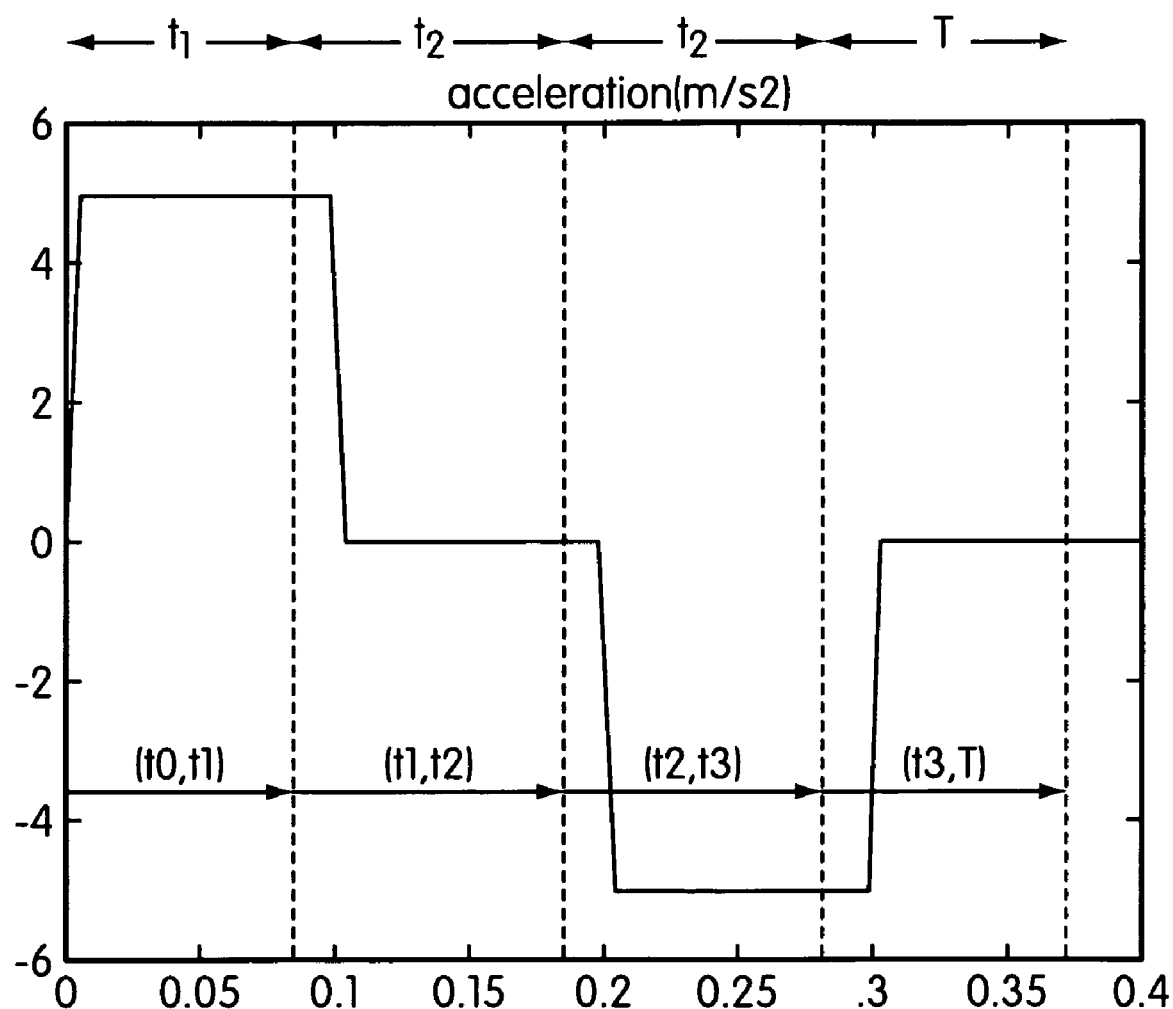
FIG. 7c depicts a time interval divided into four pieces such that the cross terms are eliminated.

As can be seen in FIG. 7b, a plane at height $c_e$ parallel with the time frequency plane is chosen. This plane is chosen to enclose the frequency components having enough energy to be picked up at this energy level. The crossing contour which results by intersecting the three dimensional energy distribution plot with the $c_e$ height plane is denoted by $\omega_k(\tilde{t})$. The constant $c_e$ is chosen to be large enough to identify no noise but small enough to consider all deterministic dynamics frequencies, that is periodic disturbances. Also, the parameter $c_e$ is selected to be large enough to eliminate any possibly remaining cross terms of the Wigner distribution.

Figure 7D:
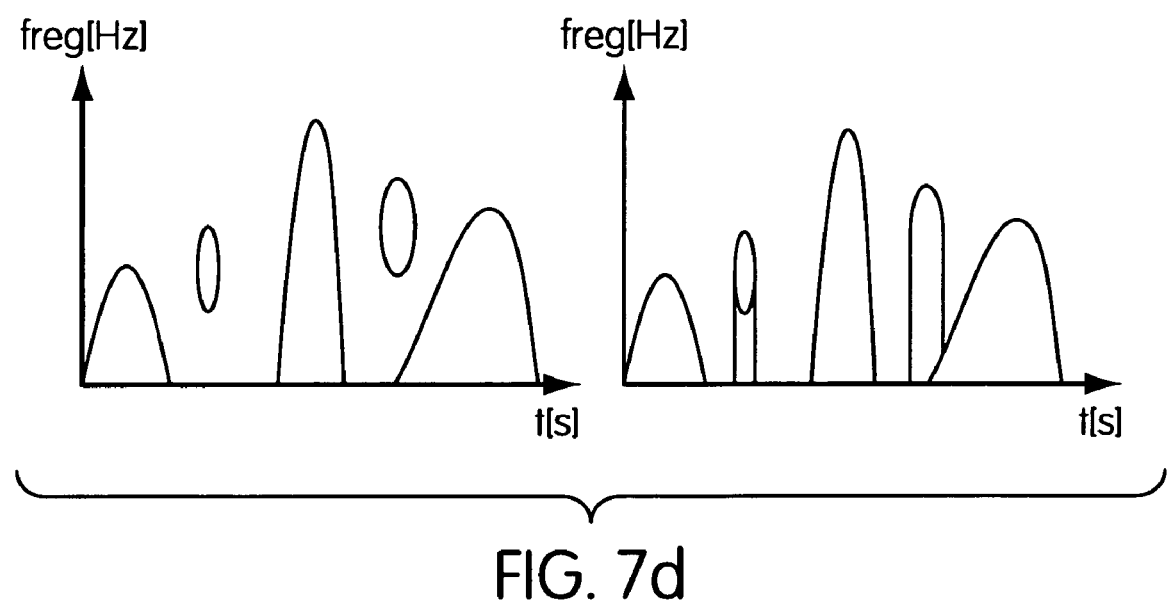
FIG. 7d depicts a graph showing a crossing contour when the Wigner distribution results shown in FIG. 4b are intersected in the three dimensional energy distribution plot with a $c_e$ height plane, where $c_e$ is a predetermined value.

FIG. 7d depicts a graph showing a crossing contour when the Wigner distribution results shown in FIG. 7b are intersected in the three dimensional energy distribution plot with a $c_e$ height plane, where $c_e$ is a predetermined value. It is noted that the obtained contour $\omega_k(\tilde{t})$ is not a function in the mathematical sense, and may have the form depicted in the left hand side diagram of FIG. 7d. The highest frequency time profile (envelope), as shown in FIG. 7d, right hand side, is considered to be $$F_k = \max(\omega_k(\tilde{t})), \text{ for } W_k(\tilde{t}, \omega_k) = c_e.$$

It will be understood that the adaptive filter Q bandwidth profile is designed based on the contour $F_k(\tilde{t})$. In particular, the adaptive filter Q is preferably, and in particular, for the following analysis, a low pass filter, namely a zero-phase Butterworth filter. The adaptive filter bandwidth $\Omega_{Qk}(\tilde{t})$ is computed in the following way:

the windowed least means square norm of the tracking error at trial k is considered, $$S_k(\tilde{t}) = \sum_{i=\tilde{t}-Tw/2}^{\tilde{t}+Tw/2} (e_k(i))^2,$$

where Tw is the length of the moving window, $e_k(i)$ is the tracking error during the k-th trial, at a certain time instant $i \in [t-Tw/2, t+Tw/2], \tilde{t} \in [\tilde{t}_{o(k)}, t_{o(k)}+T]$.

The difference is considered between the least mean square norms corresponding to the iterations k and k-1.

$$\Delta S_k(\tilde{t}) = S_k(\tilde{t}) - S_{k-1}(\tilde{t}).$$

The bandwidth $\Omega_{Qk}(\tilde{t})$ of the adaptive filter Q is updated using iterative learning and the windowed error norm change $\Delta S_k(\tilde{t})$.

This gives:

$$\Omega_{Qk}(\tilde{t}) = \Omega_{Qk-1}(\tilde{t}) + \Delta\Omega_{Qk}(\tilde{t}) \text{ and}$$

$$\Delta\Omega_{Qk}(\tilde{t}) = -F_k(\tilde{t}) \cdot \Delta S_k(\tilde{t}) \cdot \text{sign}(\Delta\Omega_{Qk-1}(\tilde{t})).$$

For the first trial $\Omega_{Q1}(\tilde{t})$ is chosen as 10 Hertz.

Next, the relationship between the filter bandwidth $\Omega_{Qk}(\tilde{t})$ and the cut-off frequency of the zero-phase Butterworth filter $Q, \sigma_k(\tilde{t})$ is computed. To do this, the time vector $\tilde{t} = (\tilde{t}i)$ is considered, where $i \in \overline{1,N}$, $N \in \mathbb{N}$ corresponding to the scanning interval. For any time instant $\tilde{t}i$, $i \in \overline{1,N}$, the bandwidth of the adaptive Q filter $\Omega_{Qk}(\tilde{t})$ is computed in Hertz. One denotes $S_i = j2\pi\Omega_{Qk}(\tilde{t})$. The parameter $\sigma_k = \sigma_k(\tilde{t}i)$ is found by solving the equation bandwidth $(Q_k(s, \tilde{t}i, \sigma_k(\tilde{t}i))) = \Omega_{Qk}(\tilde{t}i)$.

For any time instant $\tilde{t}i$, $i \in \overline{1,N}$, the relationship shown in equation (3) between the computer adaptive filter Q bandwidth $\Omega_{Qk}(\tilde{t})$ and the parameter $\sigma_k = \sigma_k(\tilde{t}i)$ is non linear. For computations, different linear approximations may be considered.

While specific embodiments of the invention have been described above, it will be appreciated that the invention may be practiced otherwise than as described. As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A method of controlling a system or process using a learned feed-forward signal, comprising:
   executing a feed-forward control of said system or process based on a first setpoint signal that is indicative of a first setpoint trajectory;
   determining an error signal between said first setpoint signal and an output signal of said system or process;
   performing a time-frequency analysis of said error signal;
   identifying frequency components and corresponding levels of said error signal as a function of time based on said time-frequency analysis;

determining a time-varying bandwidth for a filter based on the frequency components as a function of time, such that repetitive dynamic attributes exhibited by said system or process, as indicated by said frequency components, are incorporated into said learned feed-forward signal at the appropriate time instants;

applying said filter to said learned feed-forward signal; and generating a control signal in response to said applying of said filter.

2. The control method of claim 1, wherein said filter is a low-pass filter and said bandwidth function is determined by a cut-off frequency which varies in accordance with said frequency content and level of said error signal.

3. The control method of claim 1, wherein in said determining a time-varying bandwidth, said the bandwidth is lowered when said system or process does not exhibit said repetitive dynamic attributes.

4. The control method of claim 1, wherein said learned feed-forward signal has a zero value for those time instants corresponding to points along said first setpoint trajectory where the system or process does not exhibit said repetitive dynamic attributes.

5. The control method of claim 1, further including:

controlling said system or process over a second setpoint trajectory, indicated by a second setpoint signal, said second setpoint trajectory differing from said first setpoint trajectory only with respect those parts of said first setpoint trajectory which do not cause said system or process to exhibit said repetitive dynamics, wherein said feed-forward signal corresponding to said second setpoint signal is developed from said learned feed-forward signal corresponding to said first setpoint signal by inserting or removing values for said part of said second setpoint trajectory that differs from that of said first setpoint trajectory.

6. The control method of claim 5, wherein said first setpoint trajectory causes a scanning movement along a first scan length and said second setpoint trajectory causes a scanning movement along a second scan length, which is different than said first scan length.

7. The control method of claim 1, wherein said system is a lithographic scanning system, in which a beam of radiation is scanned via a patterning device onto a substrate having a partial resist layer, said control method being used to control a scanning position of either the substrate or the patterning device according to a scanning trajectory.

8. A user terminal comprising a mechanism operable to perform the method of claim 1.

9. A control system for a system or process using a learned feed-forward signal, said system comprising:

an iterative learning control element configured to execute a feed-forward control of said system or process according to a predetermined setpoint;

an analysis element configured to perform a time-frequency analysis of an error signal between said setpoint and an output of said system or process and to identify frequency components and corresponding levels of said error signal as a function of time; and an adaptive filter having a time varying bandwidth based on said frequency components of said error signal as a function of time, said filter being applied to said learned feed-forward signal to obtain a control signal to control said system or process, wherein in response to identifying repetitive dynamic attributes exhibited by said system or process based on said frequency components, said bandwidth is adjusted so that the repetitive dynamic attributes are incorporated into said learned feed-forward signal at appropriate time instants.

10. The control system of claim 9, wherein said process is a lithographic manufacturing process, in which a projection beam of radiation is scanned via a patterning device onto a substrate having a partial resist layer, said control system is adapted to control the scanning position of either the substrate or the patterning device according to a scanning trajectory.

11. A lithographic apparatus, comprising:

an illumination system configured to condition a beam of radiation;

a support configured to support a patterning device that imparts a desired pattern to the beam of radiation;

a substrate holder configured to hold a substrate;

a projection system configured to project the patterned beam onto a target portion of the substrate; and a control system configured to control movement of said support structure and/or said substrate holder along a predetermined trajectory using a learned feed-forward signal, said control system comprising:

an iterative learning control element configured to execute a feed-forward control of the movement of said support structure and/or said substrate holder according to a setpoint signal corresponding to said predetermined trajectory;

an analysis element configured to perform a time-frequency analysis of an error signal between said setpoint signal and an output signal indicative of the movement of said support structure and/or said substrate holder and to identify frequency components and corresponding levels of said error signal as a function of time; and an adaptive filter having a time varying bandwidth based on said frequency components of said error signal as a function of time, said filter being applied to said learned feed-forward signal to obtain a control signal to control said system or process, wherein in response to identifying repetitive dynamic attributes exhibited by said system or process based on said frequency components, said bandwidth is adjusted so that the repetitive dynamic attributes are incorporated into said learned feed-forward signal at appropriate time instants.

12. A computer-readable storage medium storing a program which, when run on a computer, controls the computer to perform the method of controlling a system or process using a learned feed-forward signal, comprising:

executing a feed-forward control of said system or process according based on a first setpoint signal that is indicative of a first setpoint trajectory;

determining an error signal between said first setpoint signal and an output signal of said system or process;

performing a time-frequency analysis of said error signal;

identifying frequency components and corresponding levels of said error signal as a function of time based on said time-frequency analysis;

determining a time-varying bandwidth for a filter based on the identified frequency components as a function of time, such that repetitive dynamic attributes exhibited by said system or process are incorporated into said learned feed-forward signal at the appropriate time instants;

applying said filter to said learned feed-forward signal; and generating a control signal in response to applying said filter.

13. The computer-readable storage medium of claim 12, wherein said filter is a low-pass filter and said bandwidth function is determined by a cut-off frequency which varies in accordance with said frequency content and level of said error signal.

14. The computer-readable storage medium of claim 12, wherein in said determining a time-varying bandwidth, said the bandwidth is lowered when said system or process does not exhibit said repetitive dynamic attributes.

15. The computer-readable storage medium of claim 12, wherein said learned feed-forward signal has a zero value for those time instants corresponding to points along said first setpoint trajectory where the system or process does not exhibit said repetitive dynamic attributes.

16. The computer-readable storage medium of claim 12, further including:
  controlling said system or process over a second setpoint trajectory, indicated by a second setpoint signal, said second setpoint trajectory differing from said first setpoint trajectory only with respect those parts of said first setpoint trajectory which do not cause said system or process to exhibit said repetitive dynamics,
  wherein said feed-forward signal corresponding to said second setpoint signal is developed from said learned feed-forward signal corresponding to said first setpoint signal by inserting or removing values for said part of said second setpoint trajectory that differs from that of said first setpoint trajectory.

17. The computer-readable storage medium of claim 16, wherein said first setpoint trajectory causes a scanning movement along a first scan length and said second setpoint trajectory causes a scanning movement along a second scan length, which is different than said first scan length.

18. The computer-readable storage medium of claim 12, wherein said system is a lithographic scanning system, in which a beam of radiation is scanned via a patterning device onto a substrate having a partial resist layer, said control method being used to control a scanning position of either the substrate or the patterning device according to a scanning trajectory.

19. A control system for controlling a system or process, comprising:
  an input configured to receive a first setpoint signal;
  an iterative learning control element configured to generate a learned feed-forward signal based on said setpoint signal;
  an operational element configured to determine an error signal between said setpoint signal and an output signal;
  an analysis element configured to perform a time-frequency analysis of said error signal to identify frequency components and corresponding levels of said error signal as a function of time; and
  an adaptive filter having a time varying bandwidth based on said frequency components of said error signal as a function of time, said filter being applied to said learned feed-forward signal to generate a control signal to control said system or process,
  wherein, in response to identifying repetitive dynamic attributes exhibited by said system or process based on said frequency components, said bandwidth is increased to accommodate said repetitive dynamic attributes into said learned feed-forward signal at appropriate time instants, and
  wherein, in response to not identifying repetitive dynamic attributes, said bandwidth is reduced.

20. The control system of claim 19, further including:
  a second setpoint signal that differs from said first setpoint trajectory only with respect those parts of said first setpoint which do not cause said system or process to exhibit said repetitive dynamics,
  wherein said feed-forward signal corresponding to said second setpoint signal is developed from said learned feed-forward signal corresponding to said first setpoint signal by inserting or removing values for said part of said second setpoint that differs from that of said first setpoint.

* * * * *